(12) United States Patent
Kimura et al.

(10) Patent No.: US 6,363,063 B1
(45) Date of Patent: Mar. 26, 2002

(54) SYNCHRONOUS CIRCUIT FOR FM MULTIPLE BROADCAST RECEIVER

(75) Inventors: Kazuhiro Kimura, Fukaya; Shigeaki Hayashibe; Takahiko Masumoto, both of Gunma-ken; Yutaka Hirakoso, Gyoda; Hiroshi Kaneko, Gunma-ken, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/047,824

(22) Filed: Mar. 25, 1998

(30) Foreign Application Priority Data

Mar. 31, 1997 (JP) .............................. 9-079995
Mar. 31, 1997 (JP) .............................. 9-079996

(51) Int. Cl.$^7$ .............................. H04B 7/00; H04J 3/06; H04L 7/00
(52) U.S. Cl. ........................ 370/350; 370/503; 455/550; 375/240.28
(58) Field of Search .................... 370/276–277, 370/280, 294, 304, 310, 324, 343–345, 350, 503; 340/825.72, 825.69, 825.73; 455/500–502, 3.01–3.02, 39, 42, 550; 375/240.24, 240.28, 316

(56) References Cited

FOREIGN PATENT DOCUMENTS

| EP | 0701341 A2 | 3/1996 |
| EP | 0735787 A2 | 10/1996 |
| EP | 0735787 A3 | 10/1996 |
| EP | 0736985 A2 | 10/1996 |
| JP | 06112934 | 4/1994 |

OTHER PUBLICATIONS

European Search Report dated Aug. 18, 1999 for application No. 98302345.8–2215.

*Primary Examiner*—Wellington Chin
*Assistant Examiner*—Maikhanh Tran
(74) *Attorney, Agent, or Firm*—Hogan & Hartson, L.L.P.

(57) ABSTRACT

A receiver receives FM multiplex broadcast data of both RDS and DARC systems by using one front end. A BIC detection circuit (101) detects a block identification code (BIC) included in received data. A coincidence/non-coincidence detection circuit (104) judges whether or not a BIC detection timing is correct and emits a coincidence/non-coincidence pulse. A forward protection circuit (106) counts a frequency of outputs of non-coincidence pulses and retains an established synchronous condition until the counted value exceeds a predetermined value. Then, a forward protection control circuit (108) inhibits the forward protection circuit from performing a count operation while a search is performed for selecting a station. Also, a rearward protection circuit (105) counts a frequency of outputs of coincidence pulses and establishes a synchronous condition when the counted value reaches a predetermined value. Further, a rearward protection control circuit (800) inhibits the rearward protection circuit from performing a count operation while a search is performed.

10 Claims, 14 Drawing Sheets

RDS DATA GROUP TYPE 0 VERSION B

DARC BLOCK AND FRAME CONSTITUTION

BLOCK IDENTIFICATION CODE (BIC) BIT PATTERNS

| BIC1 | 0001 | 0011 | 0101 | 1110 |
|------|------|------|------|------|
| BIC2 | 0111 | 0100 | 1010 | 0110 |
| BIC3 | 1010 | 0111 | 1001 | 0001 |
| BIC4 | 1100 | 1000 | 0111 | 0101 |

FIG. 11

SYNCHRONOUS CIRCUIT FOR FM MULTIPLE BROADCAST RECEIVER

BACKGROUND OF THE INVENTION (i) Field of the Invention

The present invention relates to a receiver which can receive an FM multiplex broadcast of DARC system, especially to a synchronous circuit which includes a forward protection circuit or a rearward protection circuit.

(ii) Description of the Related Art

For FM multiplex broadcasting, RDS (radio data system) is most common in Europe, while, in Japan, DARC (data radio channel) systems are most common.

RDS data include (1) program identification data (PI data), (2) broadcasting station name data (PS data), (3) a list of frequencies of other broadcasting stations which are broadcasting the same program (AF list), (4) program content identification data (PTY), (5) identification data of music or conversation (M/S data), (6) identification data of traffic information station (TP), (7) identification data of broadcasting of traffic information (TA) and the like.

Currently, many vehicle-mounted RDS receivers have a search function which uses this data to find another station broadcasting the same program when a receiving condition of the present station deteriorates as the vehicle moves. For example, in an AF search function, the list of the frequencies at which the same program is broadcast (AF list) is demodulated, a receiving frequency is successively switched to the stations of the frequencies on the list, the receiving electric field strengths of the stations are checked, and an AF station with a maximum receiving electric field strength is detected. Subsequently, the PI data of the detected AF station is demodulated, and it is judged whether or not the demodulated PI data and the PI data of the present station actually coincide. If they do coincide, the program is received from the AF station with the maximum receiving electric field strength. If they do not coincide, the PI data of an AF station with the next large receiving electric field strength is demodulated and it is judged whether or not the demodulated PI data and the PI data of the present station coincide. Thereafter, this operation is successively performed. The determination of the PI data is necessary because in the AF list some stations actually broadcast no RDS or a large number of stations have the same frequency. The PI data often varies.

As shown in FIGS. 1 and 2, RDS data is repeatedly transmitted in one group of 104 bits. One group consists of four blocks, each of 26 bits, and each block consists of a data portion of 16 bits and 10 check bits. A bit rate is 1.1875 KHz. One block is transmitted in about 22 msec. Therefore, one group is repeatedly transmitted in about 88 msec. The RDS data transmission system includes A and B versions. In version A, the PI data is allocated to a first block in the four blocks. Therefore, a repetition cycle of the PI data is about 88 msec. In version B, the PI data is allocated to first and third blocks in the four blocks. Therefore, the repetition cycle of the PI data is about 44 msec. Therefore, when AF search including the detection of the PI data is performed, in order to demodulate the PI data of the AF station, in addition to the repetition cycle, about 60 msec of RDS data block synchronization time is also necessary.

On the other hand, as shown in FIG. 3, one block of DARC data contains 288 bits. Further, 272 blocks constitute one frame, which is repeatedly transmitted. In 272 blocks, 82 blocks are used for correcting errors (vertical parity), while the remaining 190 blocks are used as information blocks. Each information block of 288 bits consists of 82 bits for correcting errors (horizontal parity), 14 bits of CRC for detecting errors, 176 bits of information and 16 bits of BIC (block identification code) for use in detecting synchronization of blocks and frames. Each error correcting block of 288 bits consists of 272 bits for correcting errors and 16 bits for BIC. The bit rate is 16 KHz. One block is transmitted in 18 msec. Therefore, one frame is repeatedly transmitted in about five seconds.

In Europe, some broadcasting stations are planning to deliver FM multiplex broadcasts in both the RDS and DARC systems. Therefore, if a RDS receiver having the AF search function which includes the detection of the PI data is additionally provided with an FM multiplex demodulating function of the DARC system while a front end is common to both systems, then for about 150 msec during the AF search in the RDS, DARC data as well as voice from the present station are discontinuous.

A block synchronous circuit and a frame synchronous circuit are required to demodulate the DARC system data. Each of the synchronous circuits has a forward protecting function which has a threshold value for holding a synchronous condition, even when the data cannot be exactly received because of noise. However, when the threshold value is exceeded and the data cannot be exactly received, the circuit becomes unsynchronized. Once a deviation from the synchronization occurs, a considerable amount of time is necessary to reestablish synchronization (rearward protection).

Therefore, if DARC data is discontinued for 150 msec, the BIC for synchronization cannot be detected in the DARC data of continuous eight or more blocks. Even if the forward protecting function is provided, there is a possibility that the DARC receiver is out of synchronization with the present station. Once synchronization is deviated, the received data cannot be processed or errors cannot be corrected until the synchronization is again established. During the period, the received data is ineffective.

Also, the block synchronous circuit and the frame synchronous circuit are provided with rearward protection circuits in which, even if there are about one or two bits of incorrect BIC due to noise, a non-synchronous condition can be changed to a synchronous condition by detecting BIC several times at a predetermined timing. However, once the rearward protection circuit brings back the synchronous condition with the incorrect data, an incorrect synchronous condition is continued by means of the function of the forward protection circuit.

Therefore, when AF search is performed as described above, another station is received while the receiver is not synchronous with DARC data in the present station. Then, the synchronous circuit is possibly brought back into the synchronous condition with the DARC data of another station and the noises. In this case, even if the frequency is adjusted back to that of the present station, the synchronous circuit is operated at the data timing of another station. An incorrect lock condition is continued until the forward protection circuit determines that a deviation from synchronization occurs. In the incorrect lock condition, the block synchronization or the frame synchronization cannot be correctly performed. Therefore, correct data cannot be obtained. During the period, the received data is useless.

Further, the FM multiplex data of the DARC system also includes the AF (alternative frequency) list in the same manner as the RDS. Even vehicle mounted DARC systems will be provided with a search function similar to the AF search function of the RDS receiver. Therefore, as well as in car mounted receivers DARC only systems, when AF or another search function is performed, the same problem will arise as described above.

SUMMARY OF THE INVENTION

An object of the present invention is to provide an FM multiplex broadcast receiver which prevents deviation from DARC synchronization, even when DARC data is discontinued during AF search or the like, and which can effectively receive the DARC data.

Another object of the invention is to provide an FM multiplex broadcast receiver which prevents a DARC synchronous circuit from being incorrectly locked, even when a receiving frequency is once changed to a frequency other than a frequency of a DARC data receiving station during AF search or the like, and which can effectively receive the DARC data.

According to the present invention, when an AF search including detection of PI data in RDS or another search is performed and the DARC data is long discontinued, no deviation from DARC synchronization is caused. Therefore, the data received immediately after the search is completed can be processed and errors can be corrected. No received data is made ineffective. The invention is effective especially when an RDS receiver which has an AF search function is additionally provided with an FM multiplex demodulating function of a DARC system with a common front end.

Also according to the present invention, even when another station is searched while the receiver is not in synchronization with the data of the present station, the receiver is prevented from being synchronized at the data timing of another station. After completing the search, the receiver can be immediately synchronized with the present station. Therefore, the synchronized and received data immediately after the search is completed can be processed or errors can be corrected. Ineffective data can be minimized.

BRIEF DESCRIPTION OF THE DRAWINGS

FIG. 11 shows an example of BIC bit pattern.

DETAILED DESCRIPTION OF THE PREFERRED EMBODIMENTS

Figure 1:
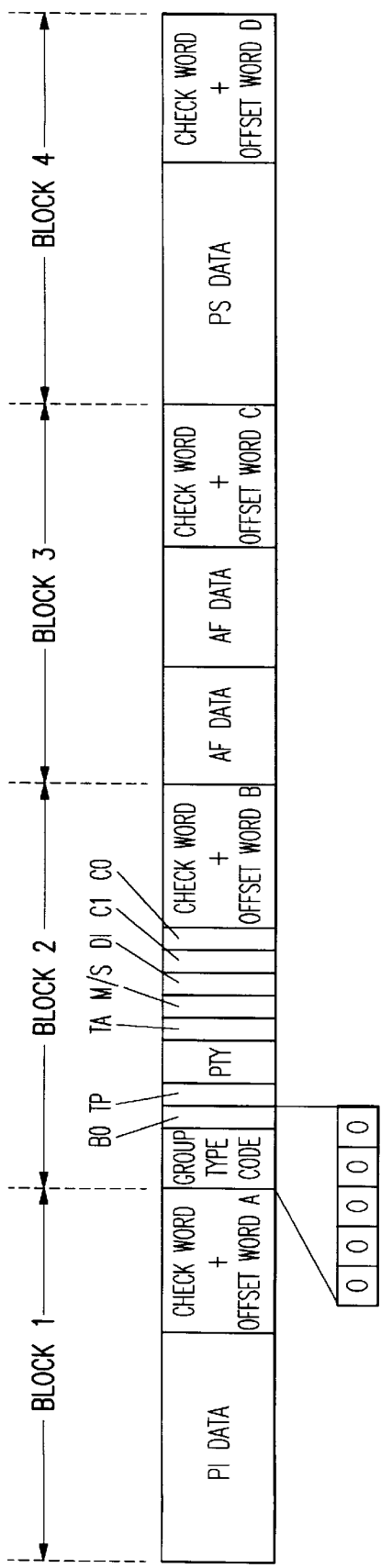
FIG. 1 shows an example of an RDS data structure of version A.
Figure 2:
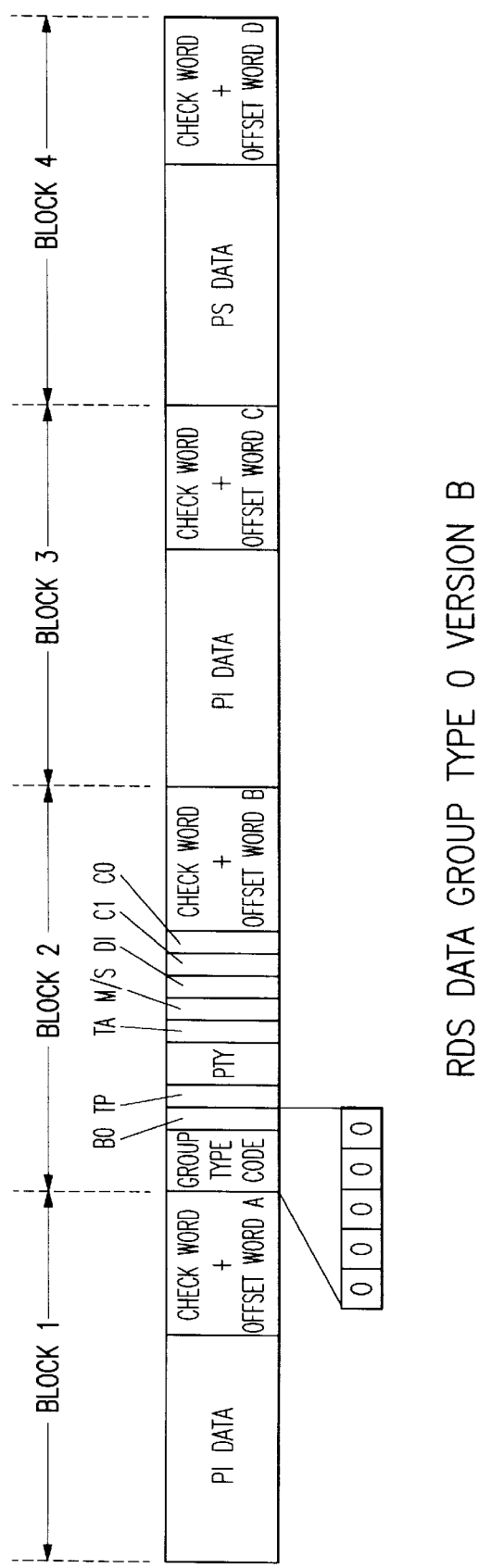
FIG. 2 shows an example of an RDS data structure of version B.
Figure 3:
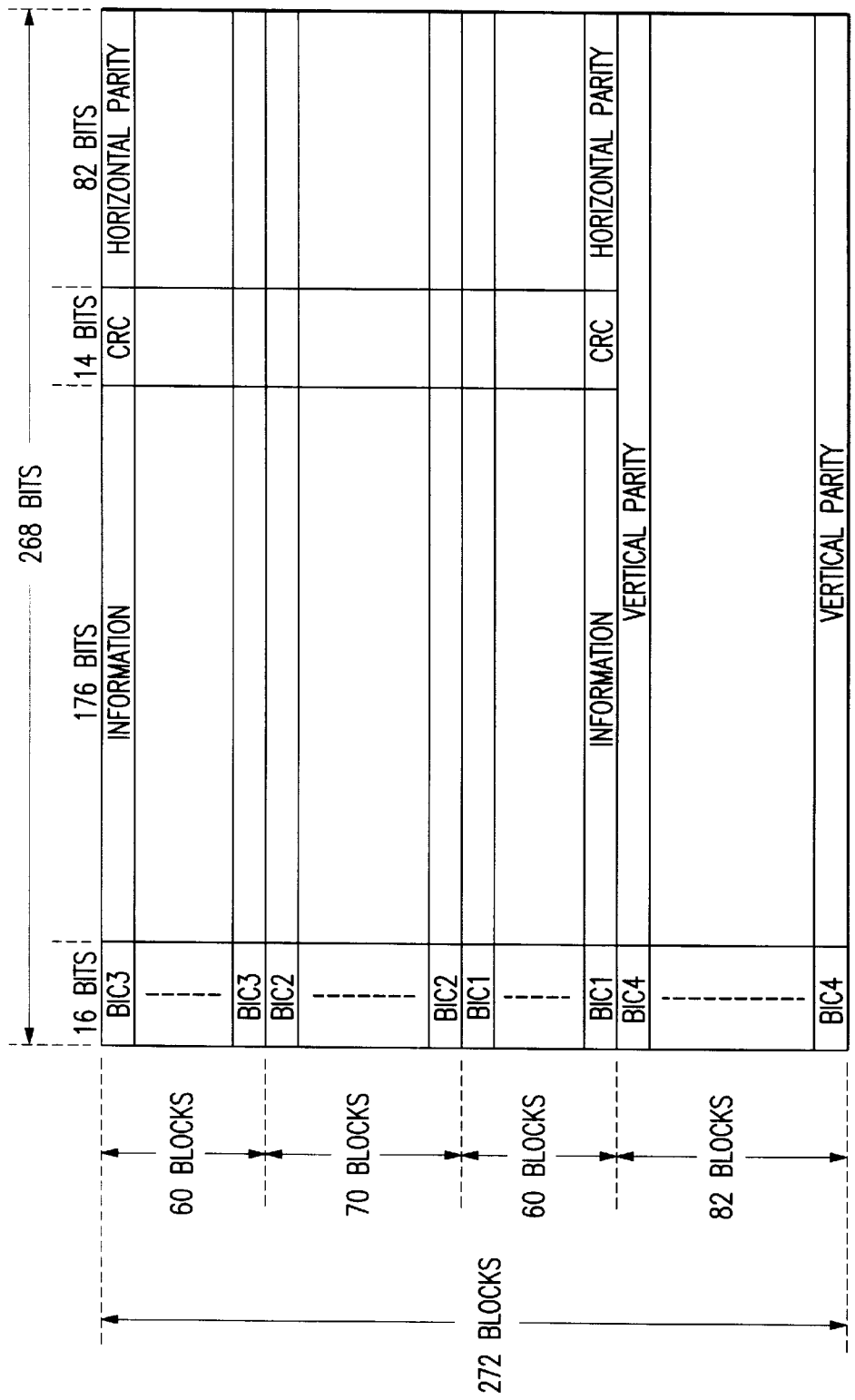
FIG. 3 shows an example of a DARC data structure.
Figure 4:
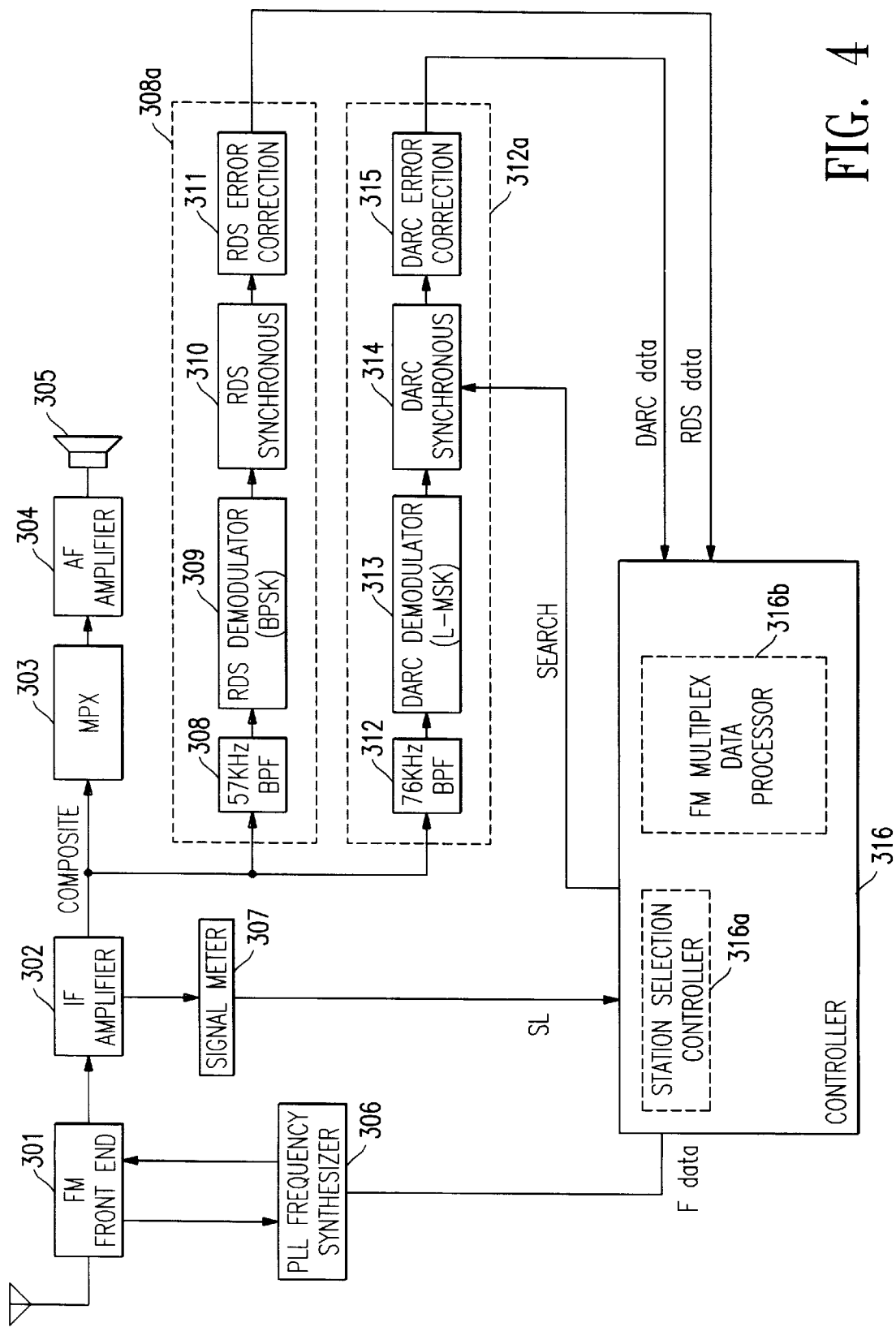
FIG. 4 is a block diagram showing a constitution of an FM multiplex broadcast receiver including a synchronous circuit according to the present invention.

FIG. 4 is a block diagram showing a constitution of an FM multiplex broadcast receiver which includes a DARC synchronous circuit 314 according to a first embodiment of the present invention. The receiver can receive the FM multiplex broadcast of both RDS and DARC systems from the same broadcasting station.

As shown in FIG. 4, an FM front end 301 is connected to an IF amplifier 302, a multiplexer 303, an AF amplifier 304, and a loudspeaker 305. The IF amplifier 302 is further connected to an RDS receiving circuit 308 a which receives a composite signal from the IF amplifier 302 and a DARC receiving circuit 312a. The RDS receiving circuit 308a comprises a band pass filter 308 with a carrier frequency of 57 KHz, an RDS demodulator 309 for performing a BPSK demodulation, an RDS synchronous circuit 310 for reproducing synchronization based on demodulated data, and an RDS error correction circuit 311 for performing an error correction. The DARC receiving circuit 312a comprises a band pass filter 312 with a carrier frequency of 76 KHz, a DARC demodulator 313 for performing an L-MSK demodulation, a DARC synchronous circuit 314 for reproducing synchronization based on demodulated data, and a DARC error correction circuit 315 for performing an error correction. After error correction, RDS data and DARC data are transmitted to a controller 316 and processed in an FM multiplex data processor 316b.

Also, the controller 316 is provided with a station selection controller 316a which transmits frequency data to an PLL frequency synthesizer 306 connected to the FM front end 301. Specifically, when an RDS AF search or other search is performed, the frequency data other than the frequency data of the present station is transmitted to the PLL frequency synthesizer 306. A search signal is transmitted to the DARC synchronous circuit 314 throughout the search operation.

Figure 5:
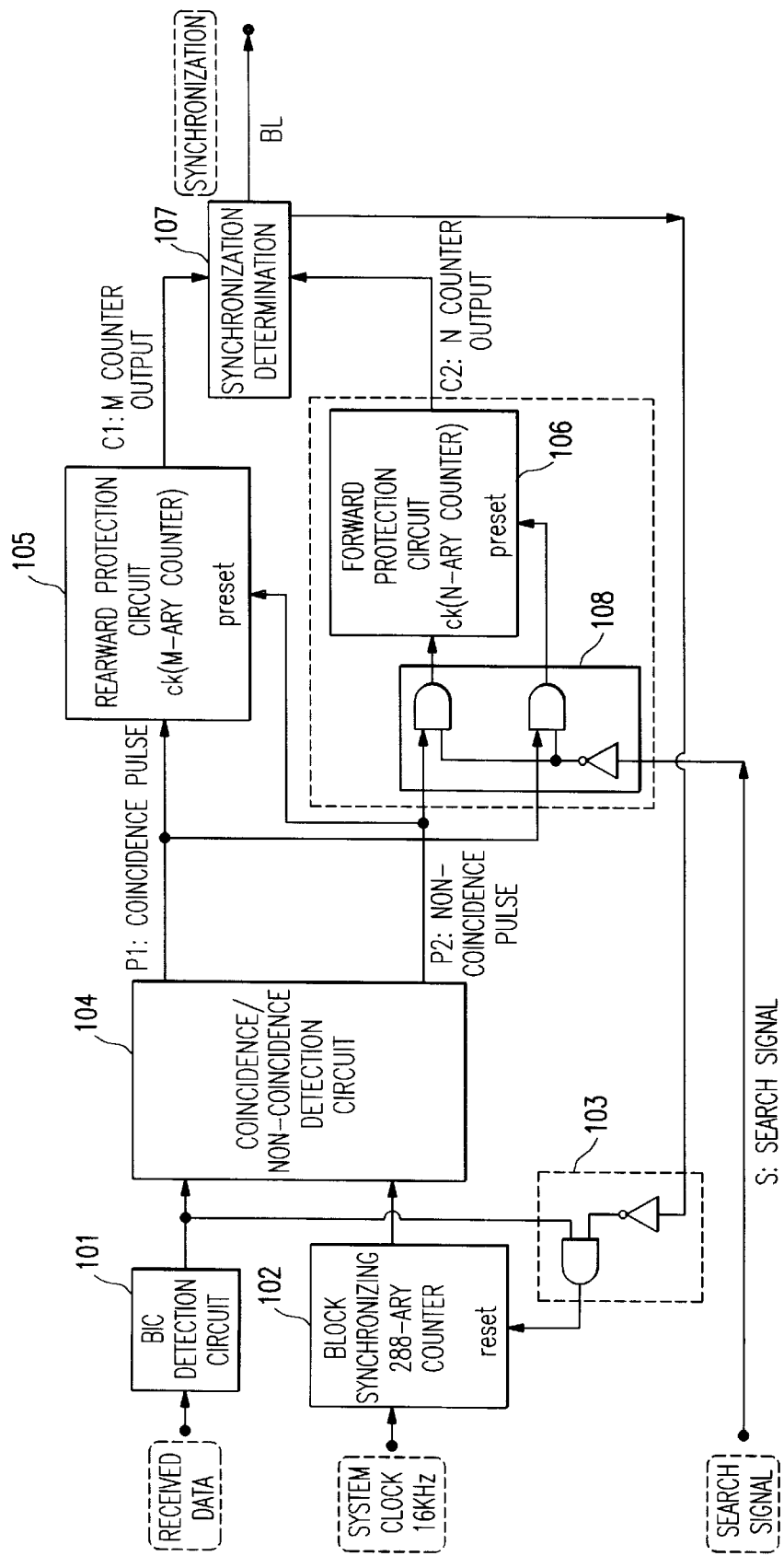
FIG. 5 is a block diagram showing a constitution according to a preferred embodiment of the present invention.

FIG. 5 shows a constitution of the DARC synchronous circuit 314 as a block synchronous circuit.

In FIG. 5, numeral 101 denotes a BIC detection circuit for detecting block identification codes (BIC) from the received data; 102 denotes a block synchronizing 288-ary counter for counting a system clock of 16 KHz (the clock with the frequency equal to the DRAC bit rate) to generate pulses at an interval of 18 msec in which one block, i.e., BIC is repeated; 103 denotes a gate circuit for initially synchronizing the BIC detection circuit 101 and the 288-ary counter 102; and 104 denotes a timing coincidence/non-coincidence detection circuit for comparing generation timings of output pulses from the BIC detection circuit 101 and the 288-ary counter 102. The BIC detection circuit 101, the block synchronizing 288-ary counter 102, the gate circuit 103 and the coincidence/non-coincidence detection circuit 104 together comprise a synchronous detection circuit. When a coincidence pulse P1 is emitted, it is determined that the BIC detection circuit 101 correctly detects the BIC from the received data. On the other hand, when a non-coincidence pulse P2 is emitted, it is determined that the BIC detection circuit 101 cannot detect any BIC or detects the BIC at a wrong timing.

Numeral 105 indicates a rearward protection circuit for establishing a block synchronization (changing a non-synchronous condition to a synchronous condition) when the coincidence pulse P1 is emitted predetermined times (M); 106 denotes a forward protection circuit for canceling the block synchronization (changing the synchronous condition to the non-synchronous condition) when the non-coincidence pulse P2 is emitted a predetermined number of times (N); and 108 denotes a forward protection control circuit which judges in response to a search signal whether or not the non-coincidence pulse P2 and the coincidence pulse P1 are passed to the forward protection circuit 106. Further, numeral 107 denotes a synchronization determination circuit which determines conditions of the forward protection circuit 106 and the rearward protection circuit 105 and emits a synchronization signal BL.

Figure 6:
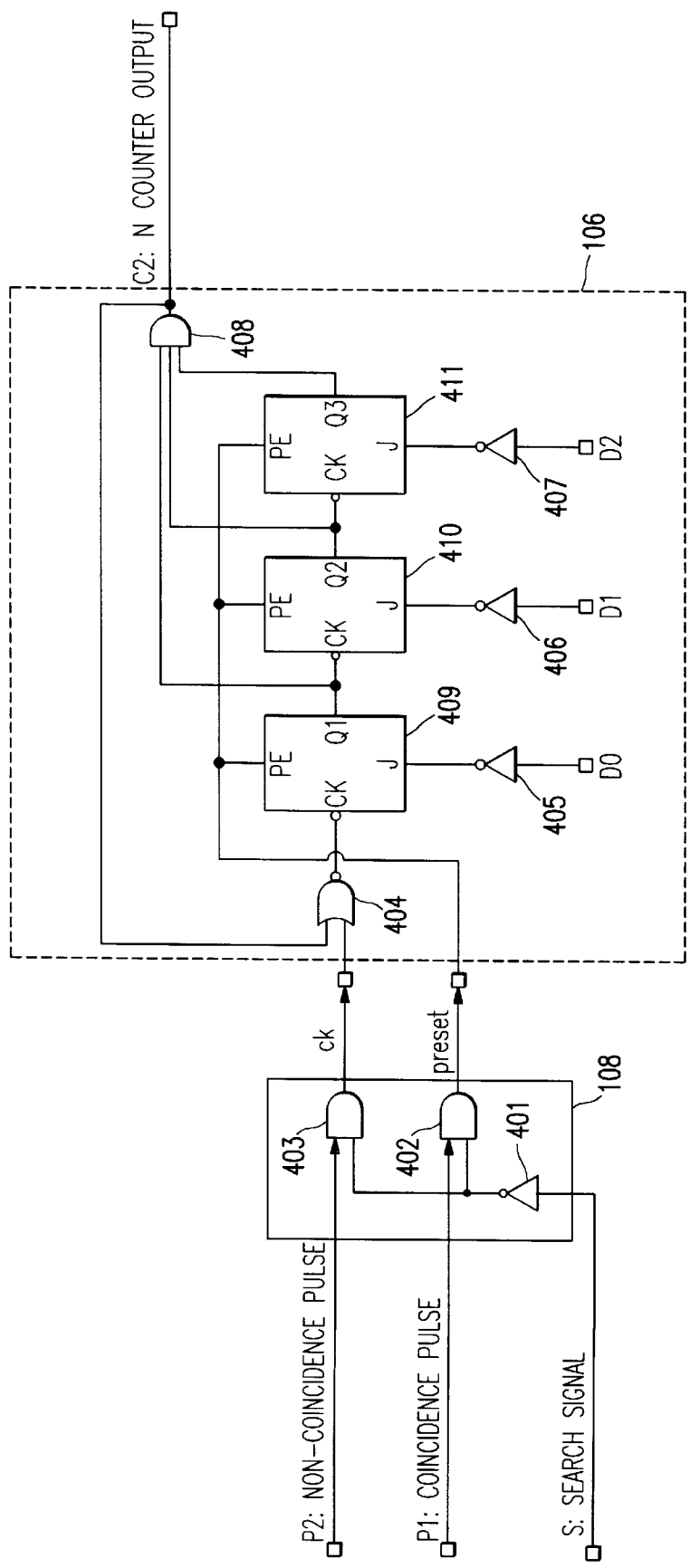
FIG. 6 shows a constitution of a forward protection control circuit and a forward protection circuit.
Figure 7:
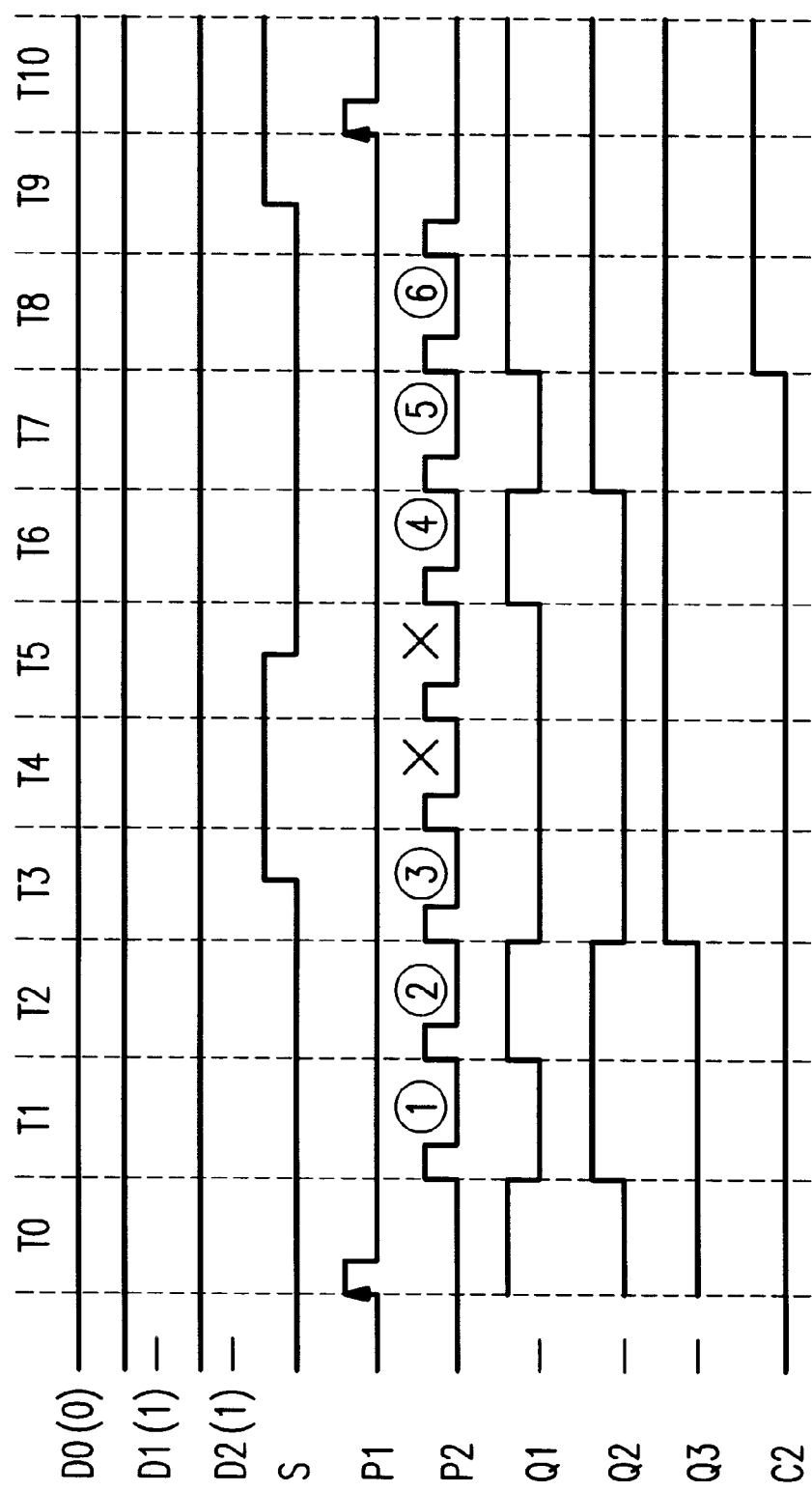
FIG. 7 is a timing chart showing an operation of a main portion in the preferred embodiment.

Additionally, a detailed circuit diagram of the forward protection circuit 106 and the forward protection control circuit 108 according to the invention and a timing chart showing operations of the circuits are shown in FIGS. 6 and 7, respectively.

As shown in FIG. 6, the forward protection control circuit 108 comprises one inverter 401 and two AND gates 402 and 403. Then, the search signal S is transmitted via the inverter 401 to the AND gates 402 and 403. Also, the coincidence pulse P1 is transmitted to the AND gate 402, while the non-coincidence pulse P2 is transmitted to the AND gate 403. Therefore, when the search signal S is at a high level and the search is performed, outputs of the AND gates 402 and 403 are set at low levels. On the other hand, when the search signal S is at a low level and no search is performed, the AND gates 402 and 403 emit the coincidence pulse P1 as a present signal and the non-coincidence pulse P2 as a clock signal ck.

Also, the forward protection circuit 106 comprises a NOR gate 404, three inverters 405, 406, 407, one AND gate 408 and three flip-flops 409, 410 and 411. Data terminals D0, D1 and D2 are connected via the inverters 405, 406 and 407 to J terminals of the flip-flops 409, 410 and 411. When the preset signal is at a high level, the data terminals D0, D1 and D2 are preset by the flip-flops 409, 410 and 411, respectively. Also, after the clock signal ck from the forward protection control circuit 108 passes the NOR gate 404, the clock signal ck is inverted and transmitted to a clock terminal CK of the flip-flop 409. An output of the AND gate 408 is transmitted to the other input terminal of the NOR gate 404.

An output Q1 of the flip-flop 409 is transmitted to the AND gate 408, and additionally inverted and transmitted to a clock terminal CK of the flip-flop 410. Also, an output Q2 of the flip-flop 410 is transmitted to the AND gate 408, and additionally inverted and transmitted to a clock terminal CK of the flip-flop 411. Then, an output Q3 of the flip-flop 411 is transmitted to the AND gate 408.

Therefore, at the high level of the coincidence pulse P1, present values (N values=D0, D1, D2) are inverted and transmitted to the flip-flops 409, 410 and 411. For example, when 6 is preset, 1, 0, and 0 are preset on the flip-flops 409, 410 and 411. Additionally, the flip-flops 409 to 411 each comprise a 3 bit binary counter. In this case, six non-coincidence pulses P2 are transmitted to the flip-flops 409, 410 and 411, which are then set to 1, 1, and 1. A high level of output is emitted from the AND gate 408. Also, since the output of the AND gate 408 is transmitted to the NOR gate 404, the output of the AND gate 408 is maintained at the high level until the preset signal is transmitted thereto.

In the timing chart of FIG. 7, N=6 (D2=1, D1=1, D0=0). Therefore, in this case, the forward protection circuit 106 is a 6-ary counter that counts up to six. First, during a time T0 of FIG. 7, the coincidence pulse P1 is emitted to preset 6 (six). Thereafter, the non-coincidence pulse P2 is emitted at T1, T2 and T3, thereby increasing the value of the counter. However, during T4 and T5, the search signal S is transmitted. Therefore, during this period, even if the signal P2 is transmitted, the counter does not increase its counted value. Subsequently, when there is no search signal S and the signal P2 is transmitted, a count operation is resumed. At a timing T8, an output C2 is emitted from the N-ary counter. Also, at T10 the preset by means of the signal P1 is inhibited while the search signal S is emitted. As explained above, by transmitting the search signal S, the coincidence pulse P1 and the non-coincidence pulse P2 to the forward protection control circuit 108, the count operation of the forward protection circuit 106 can be inhibited by the search signal. Specifically, by performing the AF search or the like including the detection of PI data in RDS, even when the DARC data of the present station is long discontinued, the synchronization of DARC can be controlled in order to not be canceled.

Figure 8:
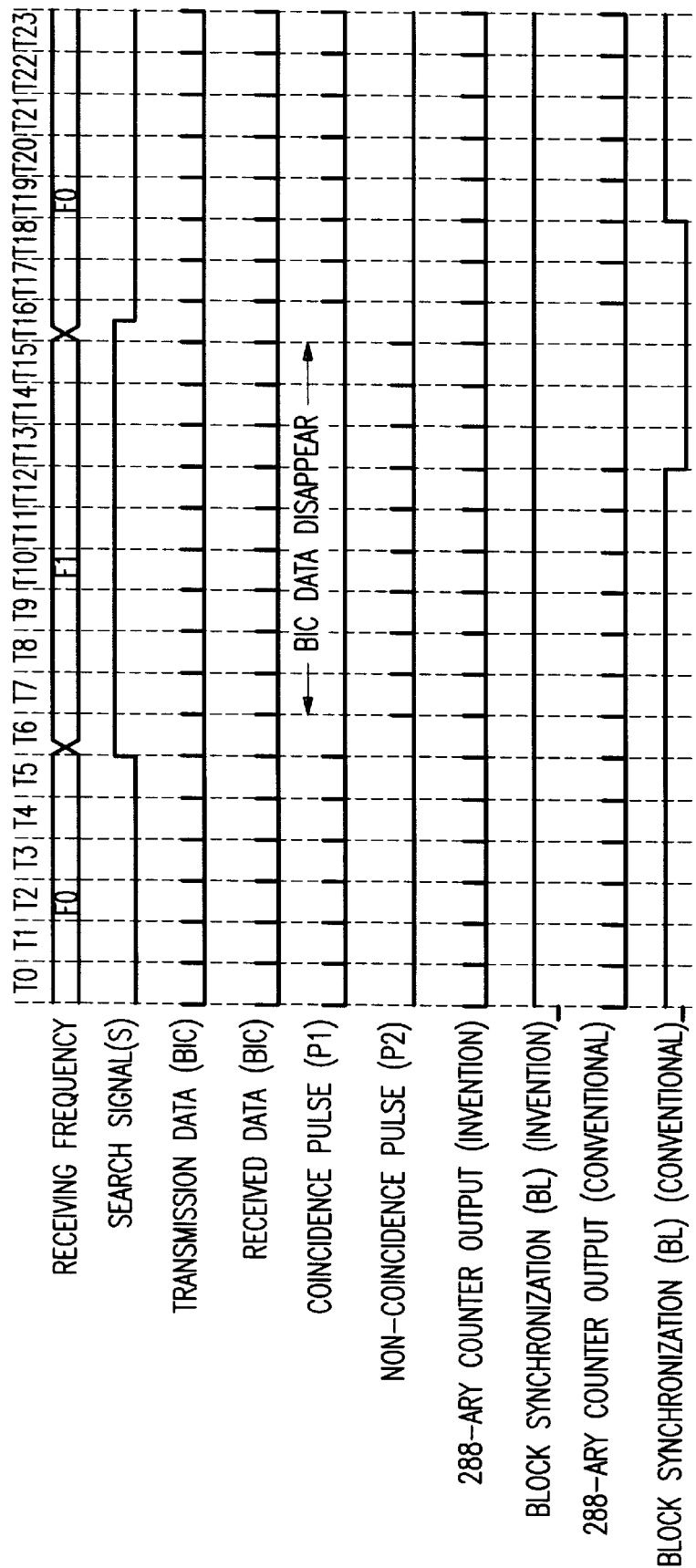
FIG. 8 is a timing chart showing an operation of the preferred embodiment.

The search operation will be described in more detail with reference to a timing chart of FIG. 8. In FIG. 8, the frequency (N) of forward protection is set to 7 times, the frequency (M) of rearward protection is set to 3 times, the present station is denoted by F0 and a searched station is denoted by F1.

In the example, while the station F1 is searched (during T6 to T15), 10 blocks of DARC data (BIC) of the station F0 disappear. In this case, according to the conventional operation, since the BIC disappears, the block synchronization is canceled because the frequency (N) of the forward protection is seven times. Specifically, the block synchronization signal BL turns to "0"during T13 to T18. Therefore, even when the present station F0 is returned to, the circuit is placed in the synchronous condition at T19 because the frequency (M) of the rearward protection is three times. On the other hand, according to the embodiment, when the searched station F1 is received, the search signal S allows the operation of the forward protection circuit to stop. Then, the BIC data disappears. Even if the non-coincidence pulse P2 is emitted with a frequency (ten times in the example) which exceeds the frequency (seven times) of the forward protection, the block synchronization circuit cannot be placed in a non-synchronous condition. Therefore, from T17 when the present station F0 is again returned to, the DARC data can be immediately retrieved.

In this embodiment, to inhibit the forward protection from being canceled during the search period, by inhibiting an input from being received, the protection counter is inhibited from operating. However, the present invention is not limited to this embodiment. For example, in the case of a counter which can be preset as shown in FIG. 6, while the preset signal PE is generated, no count operation is performed, even if the clock signal CK is transmitted. By using this function, the counter may be preset during the search period. Also, in FIG. 6, the binary counter of three bits is used. If the number of bits is increased to six, the frequency of the forward protection can be increased to 63 times. Therefore, during the search period, to inhibit the synchronization from being canceled as in the usual receiving time, the frequency of the protection is increased, extremely to say, to infinity. Then, the same effect can be obtained.

Additionally, needless to say, the invention can be applied to a receiver only of the DARC system when a search is performed in the same manner as the AF search of RDS.

Figure 9:
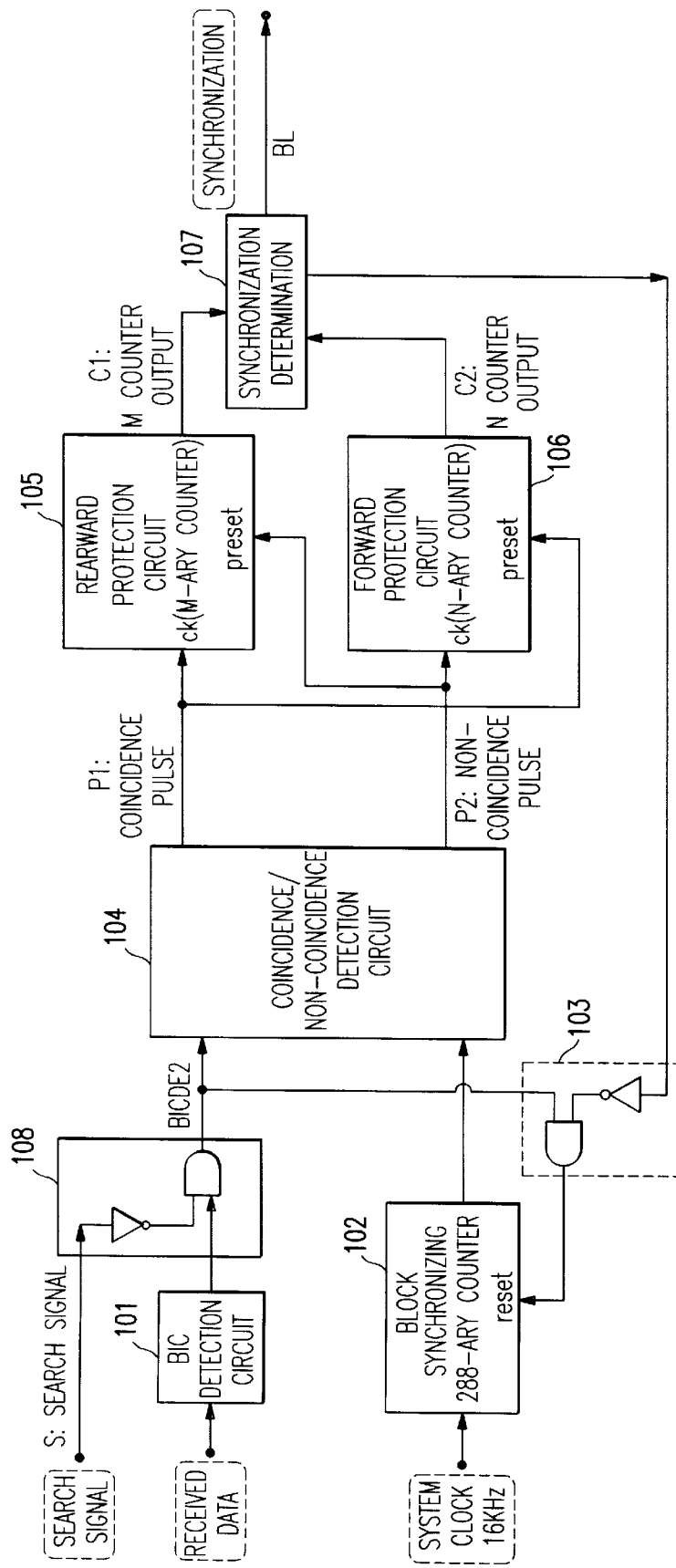
FIG. 9 is a block diagram showing a constitution according to another preferred embodiment.

Second preferred embodiment will next be described. In this embodiment, as shown in FIG. 9, a BIC detection control circuit 109 is provided before the rearward protection circuit 105. Also, a forward protection control circuit 108 is not provided. Other constitutional elements correspond to those in FIG. 5.

The BIC detection control circuit 109 inhibits the BIC detection circuit 101 from emitting an output when the search signal S is "1", i.e., during the search period. The circuit substantially stops the operation of the rearward protection circuit during the search period. Additionally, during the search period, instead of inhibiting the BIC detection circuit 101 from emitting an output, the BIC detection control circuit 109 may inhibit the received data from being transmitted.

Figure 10:
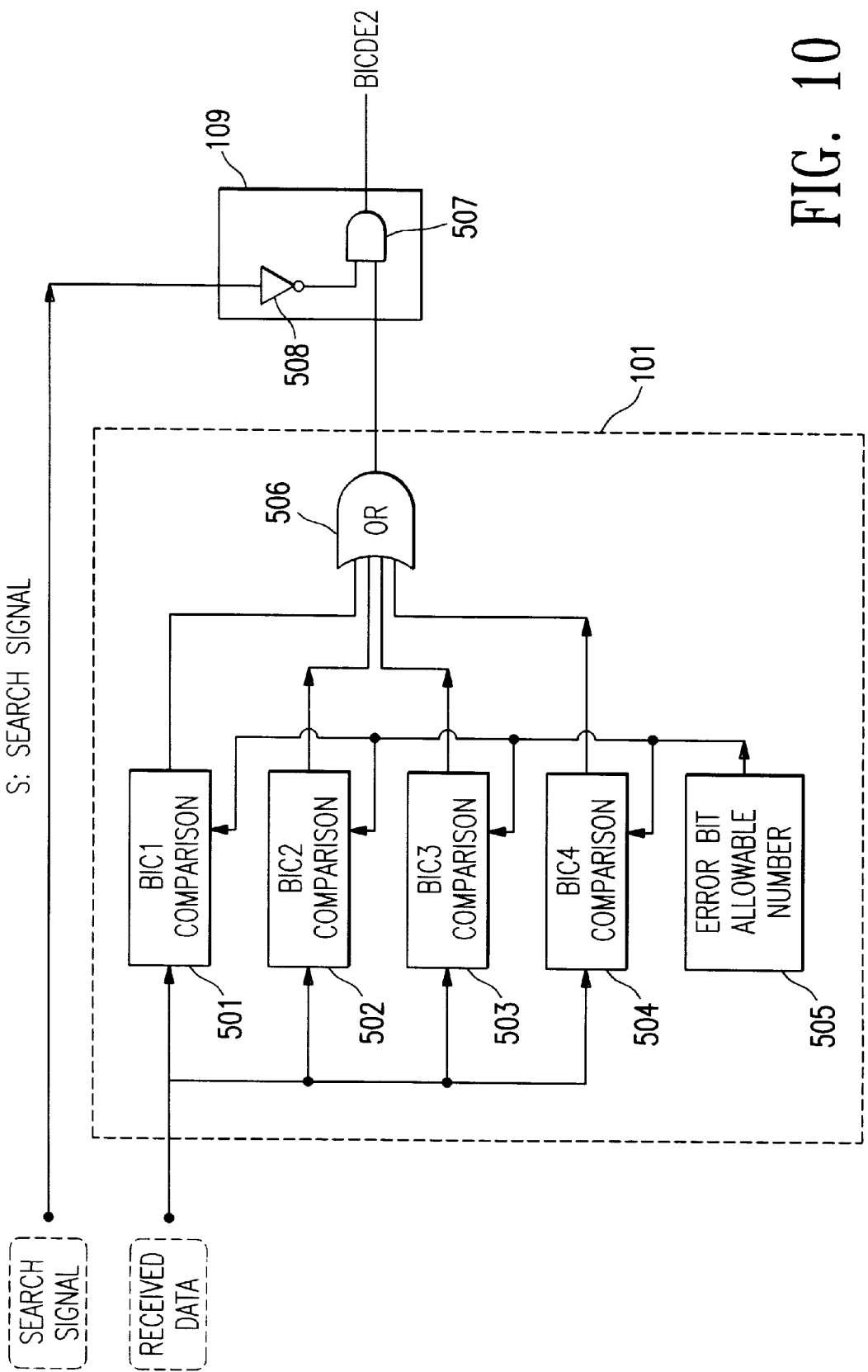
FIG. 10 shows a constitution of a BIC detection circuit and a BIC detection control circuit.

FIGS. 10 and 11 show a detailed circuit of the BIC detection control circuit 109 according to the invention and BIC bit patterns.

Four comparison circuits 501, 502, 503, and 504 of FIG. 10 compare bit patterns (BIC1 to BIC4) shown in FIG. 11 with the received data. As a result of the comparison, when the received data coincides with either one of the patterns BIC1 to BIC4, an output BICDE1 of an OR gate 506 is turned to "1". Additionally, an error bit allowable number register (setting portion) 505 sets the allowable number of errors in the comparison. The BIC detection control circuit 109 is constituted of an AND gate 507 and an inverter 508. As clearly seen from the figures, during the search period (S=1) BIC is detected. Even when the BICDE1 is "1", an output BICDE2 remains "0". On the other hand, at the time of the usual receiving when no search is performed (S=0), the output BICDE2 equals the output BICDE1. A usual BIC detection output can be obtained. Additionally, the error bit allowable number register 505 sets the allowable number of bits, at which the BIC is regarded as the relevant BIC, even when the BIC constituted of 16 bits does not coincide with the received data of a predetermined number of bits. The bit number is preferredly set in arrange of 1 to 3. If this value is zero, detection cannot be performed at the time of receiving at a weak electric field or in another case where there is an error in the received BIC.

Figure 12:
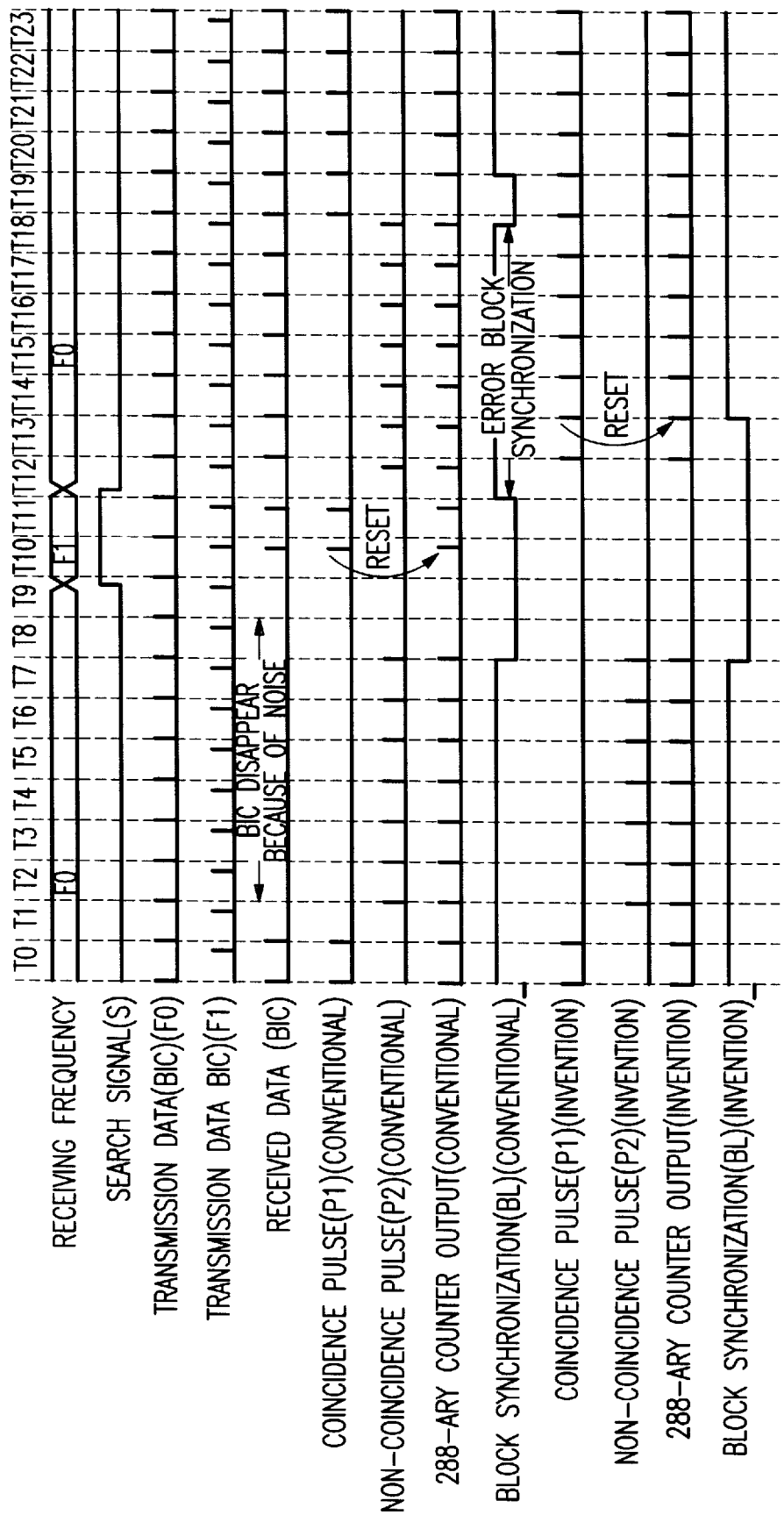
FIG. 12 is a timing chart showing an operation of yet another preferred embodiment.

The search operation will be described in more detail with reference to a timing chart of FIG. 12. In FIG. 12, the frequency (N) of forward protection is set to seven times, the frequency (M) of rearward protection is set to twice, the present station is denoted by F0 and a searched station is denoted by F1. The example shows a case in which the receiving electric field strength of the present station F0 is decreased, during time T2 to T8 the BIC disappears because of noises or the like and the synchronization is cancelled. When the station F1 is searched (T9), according to the conventional operation, during time T10 and T11 the BIC of the station F1 is detected. Then, in the synchronous circuit, the rear protection circuit detects the synchronization at the data timing of the station F1. Therefore, even at time T12 when the receiving frequency is returned to that of the station F0, till time T18 the forward protection circuit operates the synchronous circuit at the data timing of the station F1 (error block synchronization). The synchronization is not established exactly at the data timing of the station F0 until time T20.

On the other hand, according to this embodiment of the present invention, the BIC which is detected while the search signal is generated (S=1) is ignored (T10, T11). Therefore, after the search of the station F1 is completed, synchronization is established (at time T14) at the data timing of the station F0 which is detected at time T13 and T14. Therefore, even if the receiving frequency is changed to that of another station in a non-synchronous condition, the DARC synchronization is not established at the data timing of another station. When the present station is returned to and BIC is exactly detected, the synchronization can be immediately established.

In the aforementioned embodiment, the BIC detected during the search period is ignored in such a manner that the synchronization is not taken in. Also, in the circuit shown in FIG. 13, the rearward protection circuit 105 can be substantially stopped during the search period.

Figure 13:
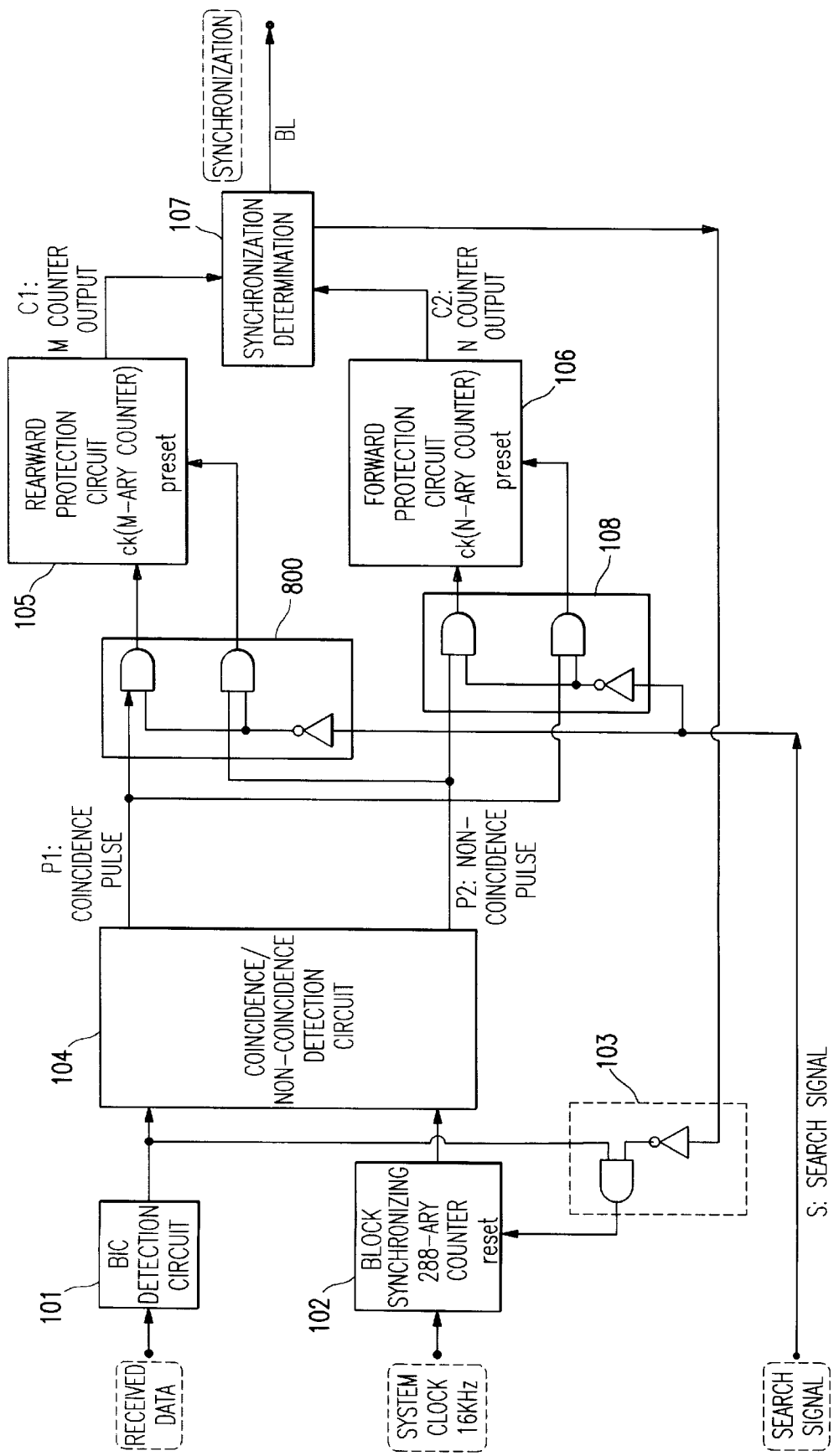
FIG. 13 shows a constitution of still another preferred embodiment.
Figure 14:
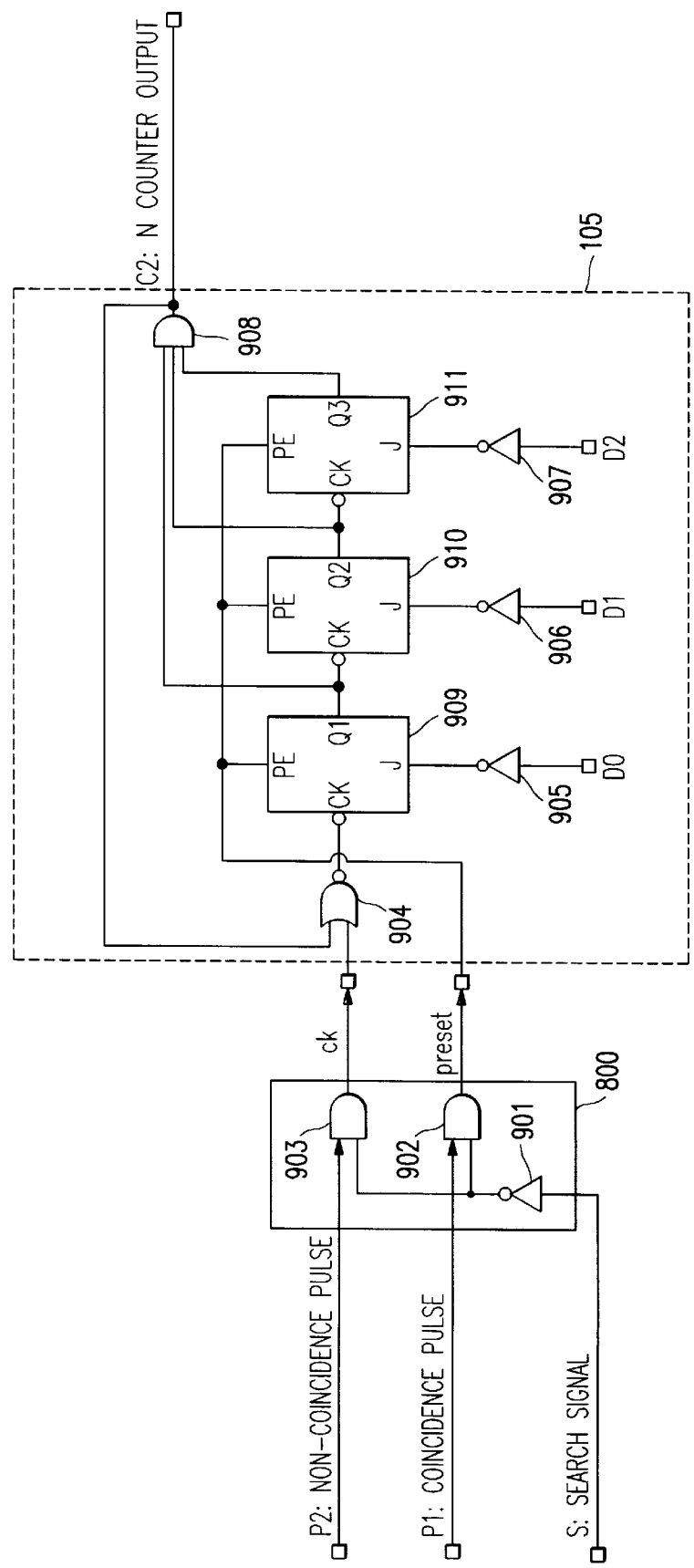
FIG. 14 shows a constitution of a main portion of the embodiment shown in FIG. 13.

Specifically, as shown in FIG. 13, a rearward protection control circuit 800 is disposed in an input stage of the rearward protection circuit 105 which is constituted of an M-ary counter. The rearward protection control circuit 800 inhibits the coincidence pulse P1 as the clock signal ck and the non-coincidence pulse P2 as the preset signal preset from being supplied to the rearward protection circuit 105. A detailed circuit of the rearward protection circuit 105 and the rearward protection control circuit 800 is shown in FIG. 14.

The rearward protection control circuit 800 thus has a constitution corresponding to that of the forward protection control circuit 108 shown in FIG. 6, and comprises one inverter 901 and two AND gates 902 and 903. When the search signal S is at a high level, the AND gates 902 and 903 are inhibited from emitting outputs. Also, the rearward protection circuit 105 comprises a binary counter in the same manner as the forward protection circuit and, specifically, consists of one NOR gate 904, three inverters 905, 906, 907, one AND gate 908 and three flip-flops 909, 910, and 911. Then, by means of the non-coincidence pulse P2, preset values (M values=D0, D1, D2 are inverted) are set on the flip-flops 909, 910, and 911. The counter counts up the coincidence pulses P1 until the preset values are reached.

However, the invention is not limited to the aforementioned embodiment. For example, in the case of the counters (909, 910, 911) which can be preset as shown in FIG. 14, while the preset signal PE is generated, the count operation is not performed, even if the clock signal CK is transmitted. By using this function, during the search period, the counters may be in preset conditions. Also, in FIG. 14, a three bit binary counter is used. If the number of bits is increased to six, the frequency of the rearward protection can be increased to 63 times. Therefore, during the search period, to inhibit the synchronization from being canceled as in the usual receiving time, the frequency of the protection is increased up to a theoretical infinity. The same effects can then be obtained. Additionally, as shown in FIG. 13, a forward protection control circuit 108 is also provided.

Additionally, the invention can obviously be applied to a DARC only receiver when a search is performed in the same manner as the AF search of RDS.

What is claimed is:

1. A synchronous circuit in a receiver which receives an FM multiplex broadcast data including a block identification code, said synchronous circuit comprising:

a synchronization detection circuit for judging whether or not said block identification code is detected at a predetermined timing, to perform synchronization detection;

a forward protection circuit for retaining an established synchronous condition until a frequency at which the synchronization detection circuit detects non-synchronization exceeds a predetermined value; and a forward protection control circuit for stopping an operation of said forward protection circuit during a search period based on a search signal indicating the search period.

2. The synchronous circuit according to claim 1 wherein said FM multiplex broadcast data is an FM multiplex broadcast data of a DARC system.

3. The synchronous circuit according to claim 2 wherein said receiver can receive both the FM multiplex broadcast data of the DARC system and the FM multiplex broadcast data of an RDS system, and said search signal is a search signal for selecting an RDS station.

4. The circuit according to claim 1 wherein said forward protection circuit has a counter for counting a frequency at which said synchronization detection circuit detects non-synchronization, and said forward protection control circuit inhibits said counter from performing a count operation during the search period.

5. The circuit according to claim 1 wherein said forward protection control circuit increases said predetermined value in response to an input of said search signal.

6. A synchronous circuit in a receiver which receives an FM multiplex broadcast data including a block identification code, said synchronous circuit comprising:

a synchronization detection circuit for judging whether or not said block identification code is detected at a predetermined timing, to perform synchronization detection;

a rearward protection circuit for establishing a synchronous condition when a frequency at which the synchronization detection circuit detects synchronization reaches a predetermined value; and a rearward protection control circuit for stopping an operation of said rearward protection circuit during a search period based on a search signal indicating the search period.

7. The synchronous circuit according to claim 6 wherein said FM multiplex broadcast data is an FM multiplex broadcast data of a DARC system.

8. The synchronous circuit according to claim 7 wherein said receiver can receive both the FM multiplex broadcast data of the DARC system and the FM multiplex broadcast data of an RDS system, and said search signal is a search signal for selecting an RDS station.

9. The circuit according to claim 6 wherein said rearward protection circuit has a counter for counting a frequency at which said synchronization detection circuit detects synchronization, and said rearward protection control circuit inhibits said counter from performing a count operation during the search period.

10. The circuit according to claim 6 wherein said rearward protection control circuit increases said predetermined value in response to an input of said search signal.

* * * * *